United States Patent [19]
Alcouffe et al.

[11] Patent Number: 5,187,438
[45] Date of Patent: Feb. 16, 1993

[54] SHIELDED MAGNETOMETER

[75] Inventors: François Alcouffe, Grenoble; Jean Crescini, Domene; Denis Duret, Grenoble, all of France

[73] Assignee: Commissariat A l'Energie Atomique, Paris, France

[21] Appl. No.: 669,626

[22] Filed: Mar. 14, 1991

[30] Foreign Application Priority Data

Mar. 23, 1990 [FR] France ................... 90 03739

[51] Int. Cl.⁵ .............................................. G01V 3/00
[52] U.S. Cl. ........................................ 324/301; 324/302
[58] Field of Search ............... 324/300, 301, 302, 305, 324/307, 316, 318, 322; 336/84 R, 84 C, 84 M

[56] References Cited

U.S. PATENT DOCUMENTS

| | | | |
|---|---|---|---|
| 3,909,706 | 9/1975 | Grescini et al. | 324/301 |
| 4,504,812 | 3/1985 | Moermond et al. | 336/84 C |
| 4,546,317 | 10/1985 | Hinton | 324/301 |
| 4,734,645 | 3/1988 | Glenart et al. | 324/301 |

FOREIGN PATENT DOCUMENTS 0206931 12/1986 European Pat. Off. .
3438702 4/1986 Fed. Rep. of Germany .

OTHER PUBLICATIONS

K. Hirao et al., Journal of Geomagnetism and Geoelectricity, "Large Spherical Magnetic Shield Room", vol. 37, 1985, pp. 581–588.

Primary Examiner—Louis Arana
Attorney, Agent, or Firm—Oblon, Spivak, McClelland, Maier & Neustadt

[57] ABSTRACT

An improved shielded magnetometer including a resonant probe containing a magnetically resonating material held in a resonator. The magnetometer has a spherical electromagnetic shield which exhibits improvements in the sensitivity characteristics by removing the effects of interference fields when the magnetometer is rotated about its axis.

11 Claims, 2 Drawing Sheets

SHIELDED MAGNETOMETER

BACKGROUND OF THE INVENTION

1. Field of the Invention

The present invention relates to an improved shielded magnetometer. It is used in the precise measurement of slowly variable magnetic fields and in particular the earth's magnetic field, whose value is approximately $2.3 \cdot 10^{-5}$ to $7 \cdot 10^{-5}$ Tesla, as a function of the latitude.

2. Discussion of the Related Art

The magnetometer according to the invention is either of the nuclear magnetic resonance oscillator type (NMR), or of the electronic paramagnetic resonance oscillator type (EPR). Such magnetometers are known and are e.g. described in French Patent Application FR-A-2 583 887 and FR-A-2 603 384. Therefore there is no need to describe them in detail here.

However, it is pointed out that the operation of a magnetometer is based on the principle of the magnetic resonance of the protons or electrons which, in the presence of a magnetic field B, precess around the direction of said field at a frequency F, called the Larmor frequency and which is proportional to the modulus of B:

$$F = \frac{\gamma}{2\pi} \cdot B$$

in which $\gamma$ designates the gyromagnetic ratio of the proton or electron.

Bearing in mind the values assumed by the earth's field, the resonant frequencies observed are between 1000 and 3000 Hertz for NMR magnetometers and between $0.7 \cdot 10^6$ Hertz for EPR magnetometers.

The performance characteristics of these magnetometers can be reduced through the presence of interfering signals in the measuring range. These can be harmonics of industrial frequencies (50 or 400 Hz) for NMR magnetometers or radiowaves for EPR magnetometers.

Moreover, the presence of a significant field gradient (exceeding 100 nonoTesla/m) leads to a deterioration in the performance characteristics of a NMR magnetometer. The EPR magnetometer is much less sensitive to the gradient and the gradient must exceed 50 micro Tesla/m for there to be a deterioration in the signal.

Thus, if it is wished to optimize the operation of these magnetometers, they should be protected as far as possible against interfering signals, whilst still permitting the measurement of the slowly variable or continuous (d.c.) fields (0 to 1 Hz) like the earth's magnetic field.

This technical problem of providing a protection against alternating or a.c. electromagnetic fields, whilst still permitting the transmission of slowly variable or d.c. fields has a known solution in the shielding of the probe by a passive electromagnetic screen.

The attached FIG. 1 shows in exemplified manner a NMR magnetometer probe shielded according to the arrangement described in FR-A-2 583 887. As shown, the probe comprises two bottles 20, 22 with a radial solution. These two bottles are externally coated with a silvered metal coating respectively 30 and 32, subdivided into non-contiguous sectors (to avoid circumferential eddy currents). The probe also incorporates a central conductor formed from two half-sections 33a and 33b. The left-hand end 34 of the section 33a is connected to the central core of a coaxial supply cable 36, whilst the right-hand end 38 of section 33b is connected to the conductive layer 32 of the bottle 22 by conductive strips 39. A tuning capacitor 50 is provided between the sections 33a and 33b. The sampling and exciting windings of said probe comprise two hemispherical windings 40, 42 outside the resonator and two flat coils 44, 46 inside the resonator.

The shield of said probe is cylindrical and is constituted by metal, e.g. silver strips 48 deposited on an insulating support.

Although satisfactory in certain respects, said means suffers from a disadvantage with respect to the shield. Thus, the measurement of variations of the earth's field aims at detecting magnetic anomalies, which e.g. indicate an immersed ferromagnetic structure (ship or the like). The measurements are performed remotely, the probe being located on an aircraft or helicopter. However, such carriers are obviously exposed to rotary movements (roll, pitch and yaw). These movements when applied to the magnetometer and it shield lead to the appearance of an interference magnetic field induced by the eddy currents flowing in the shield. This interference field disturbs the measurement of the earth's field and is prejudicial to the detection of anomalies.

In general terms, the aim is that when the shield probe is rotated, its performance characteristic are not deteriorated by the presence of an induced interference magnetic field and this is the function of the shield. The Expert having no manufacture the same will generally give it a cylindrical shape, as in the example of FIG. 1, or possibly a parallelepipedic shape, because these shapes are easy to obtain.

SUMMARY OF THE INVENTION

However, the Applicant has found that in the envisaged application, when using such shapes the rotary movements to which the shield is exposed lead to the appearance of a non-negligible, induced interference magnetic field, which is composed of the earth's field to be measured and the measurement thereof is disturbed.

The solution recommended by the Applicant is then to use a spherical shield. Such a shield, combined with a NMR or EPR magnetometer probed and exposed to the movements described hereinbefore, will see the appearance of an induced field, but in this case the field will always be perpendicular to the earth's field to be measured, as will be made apparent hereinafter. The two vectors will be summated, but their orthogonality will minimize the disturbance.

The Applicant has been able to demonstrate that the interference field induced by rotation, in the case of a magnetometer provided with a cylindrical shield of diameter 18 cm and length 20 cm, is 400 picoTesla for a speed of rotation of 1°/second, whereas for a magnetometer equipped with a spherical shield according to the invention with a diameter of 30 cm, the induced interference field drops to 10 picoTesla for the same speed of rotation, which represents a gain by a factor of 40.

It should be noted that as such a spherical shield is not novel, being described e.g. in the Article by K. HIRAO et.al. entitled "Large Spherical Magnetic Shield Room", published in the Journal "Jour. Geomag. Geoelectr.", vol. 37, pp 581-588, 1985. However, it must be stressed that such shields are intended to completely insulate a measuring laboratory. Under these conditions, the shields have very considerable dimensions (diameter 6 to 8 meters) and are made from ferromagnetic materials (i.e. with a very high permittivity) in order to completely prevent the earth's magnetic field and also other external interference fields from penetrating the measuring laboratory. It is therefore a total magnetic shield.

In the problem which is to be solved by the present invention, there is no question of blocking the earth's magnetic field, because it is the latter which it is wished to measure. Therefore the shield must be electromagnetic rather than magnetic. Reference must be made in this connection to the difference between a magnetic shield and an electromagnetic shield. A magnetic shield is formed from one or more layers of ferromagnetic materials, whose relative permeability is high compared with unity, which ensures an attenuation of the magnetic field, even for d.c. fields. However, an electromagnetic shield is formed from one or more layers of diamagnetic or paramagnetic materials such as copper, silver and aluminum, whose relative permeability is very close to unity. Therefore the attenuation for d.c. fields is low and increase with the frequency.

An electromagnetic shield with a thickness less than the skin thickness will behave like a first order low-pass filter (attenuation 6 dB/octave). For a shield thickness exceeding skin thickness, attenuation will increase more rapidly.

On returning to the prior art document relating to spherical shields, it must be stressed that it makes no reference to the rotation of the shield. The problems caused by the rotation are consequently not addressed and correlatively the advantages associated with the spherical shape are not mentioned.

Thus, despite an analogy of vocabulary, the technical problems solved in the prior art are not the same as in the present invention.

After adopting the spherical shape in the present invention, it remained necessary to solve different problems, namely a practical realization of the shape. The invention recommends the use of two hemispheres assembled with one another around the probe.

The invention is described in greater detail hereinafter relative to non-limitative embodiments and the attached drawings, which show:

BRIEF DESCRIPTION OF THE DRAWINGS

FIG. 2 shows why a spherical shield reduces the effect of the interference magnetic field induced by the rotation of the screen.

DETAILED DESCRIPTION OF THE PREFERRED EMBODIMENTS

A conductive sphere S is assumed to be immersed in a uniform magnetic field $\vec{B}(t)$, in which t is time. If the sphere is rotated, this amounts in the case of the sphere to the rotation of the field in the opposite direction. For the sphere, the field at the time $\overline{t+dt}$ become $\overline{B(t+dt)}$. Everything happens as if a field $d\vec{B}$ was formed with $\vec{B}(t)$, the field $d\vec{B}$ being substantially perpendicular to $\vec{B}(t)$ (as a first approximation).

The variation of the field leads to the appearance of currents induced in the sphere, whose direction is such that the induced field $d\vec{B}i$ opposed the variation which has given rise to it (Lenz's law). This induced field is opposed to $d\vec{B}$ and is also substantially perpendicular to $\vec{B}(t)$. Therefore and still in a first approximation, the induced field does not significantly modify the field to be measured. The spherical shape means that this conclusion is valid no matter what the orientation of the field $\vec{B}(t)$. The shield and its magnetometer can consequently be rotated in random directions and the second order disturbance will be the same no matter what the orientation of the shield relative to the field to be measured.

Figure 3:
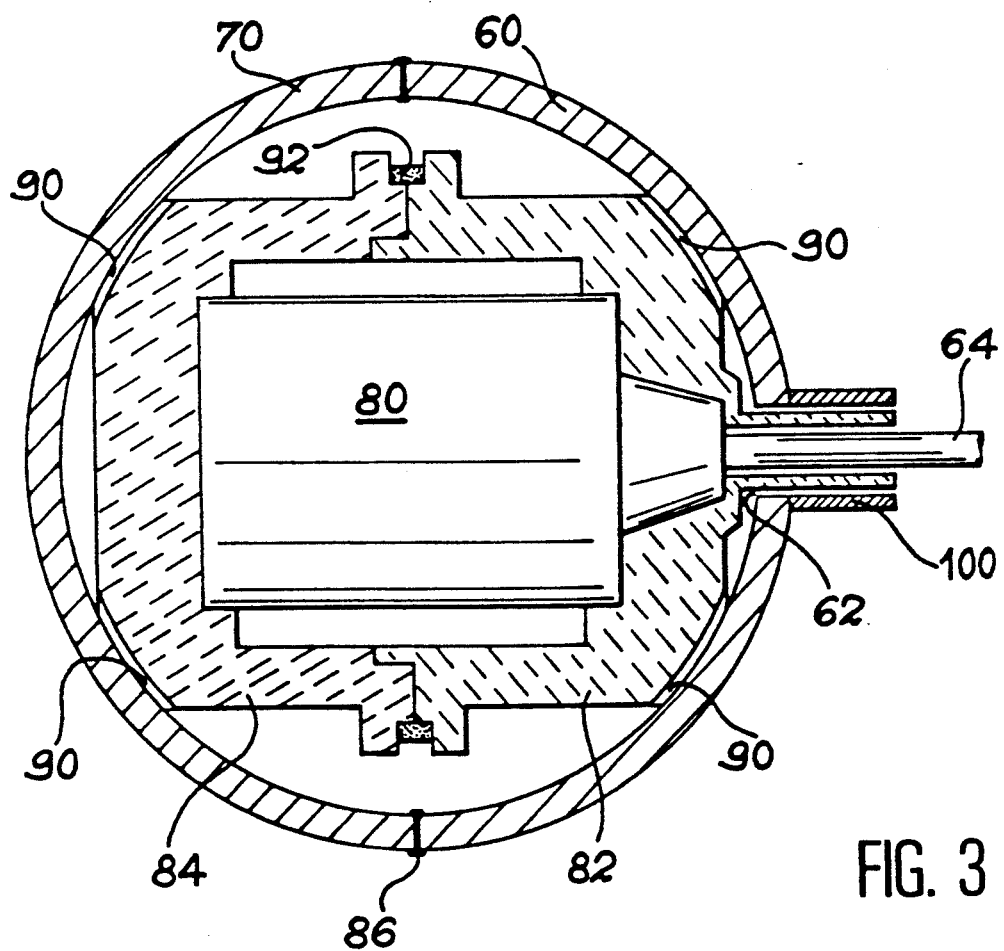
FIG. 3, in section, a spherical shielded magnetometer according to the invention.

FIG. 3 shows an embodiment of a spherical shielded magnetometer according to the invention. As shown, the shield is constituted by on the one hand a first hemisphere 60 having an opening 62 which is traversed by a supply cable 64 and on the other hand a second hemisphere 70 assembled with the first.

The first hemisphere 60 is connected to an exhaust tube 100 arranged around the opening 62 and surrounding the supply cable 64 of the probe 80. The length of the exhaust tube 100 is preferably at least equal to its diameter. The longer the exhaust tube, the better the attenuation of the external a.c. fields.

Figure 1:
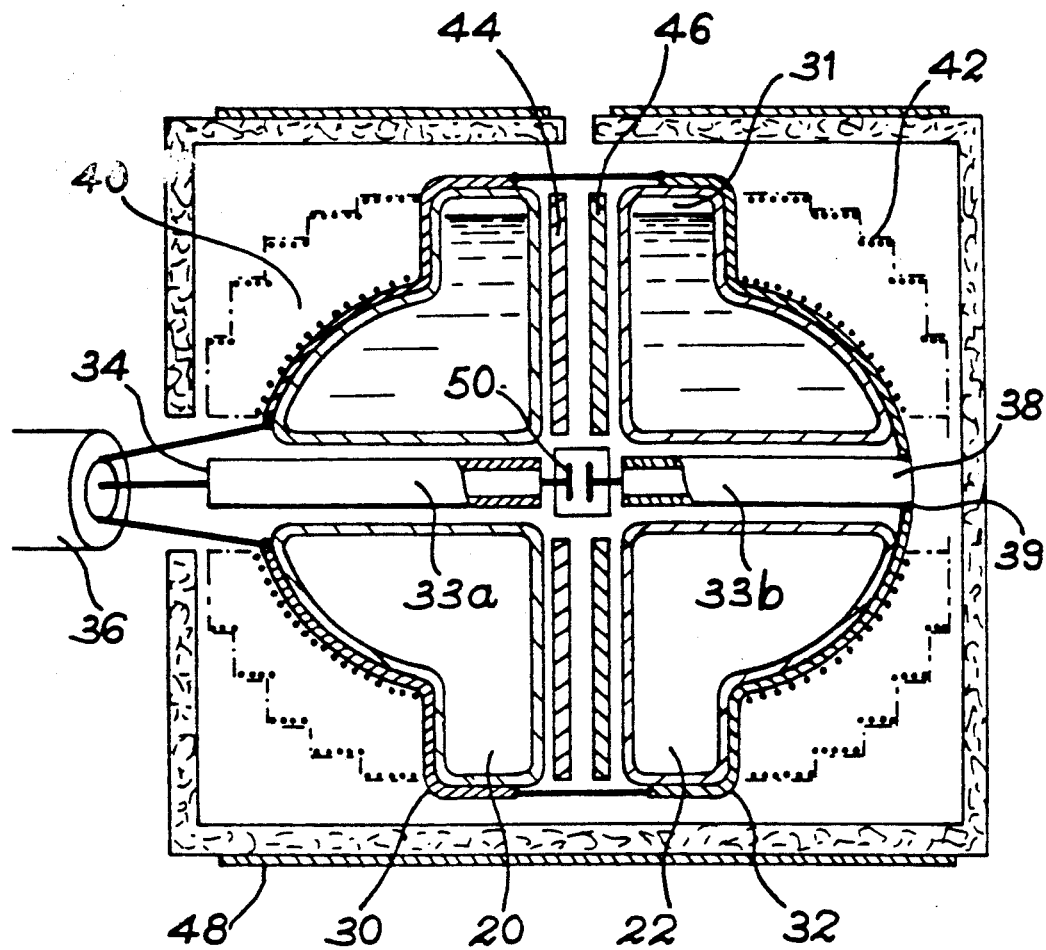
FIG. 1, already described, a prior art magnetometer.
Figure 2:
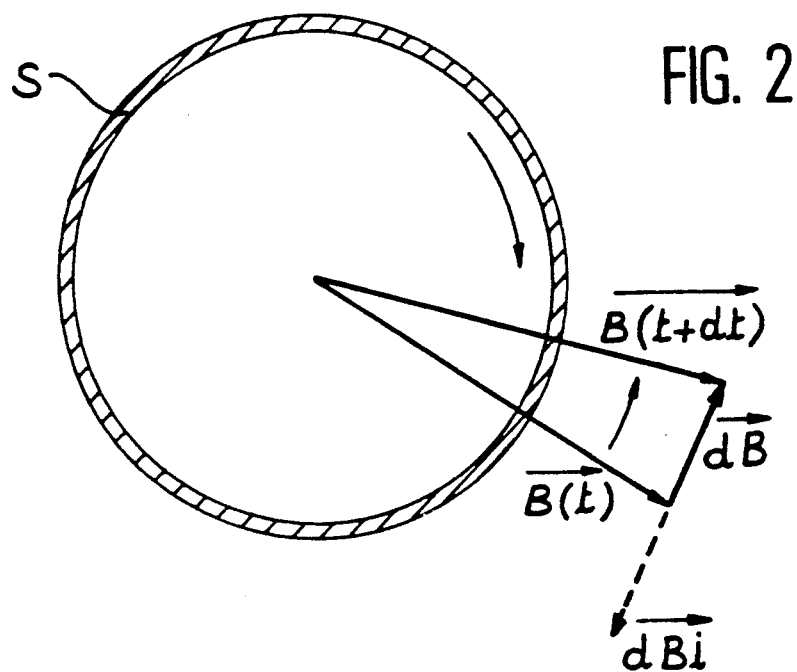
FIG. 2 a diagram showing how the real field and interference field are formed.

The probe 80 can be of the NMR or EPR type. In the first case, it can be in accordance with that of FIG. 1. The probe is held in an amagnetic insulating support formed from two assembled parts 82, 84, each located in one of the hemispheres and bearing on the inner surface thereof. The two hemispheres 60, 70 are welded to one another over their entire thickness along a weld 86.

Preferably, the two hemisphere are welded to one another by a weld obtained by an electron beam. The welding temperature can be 600° C. Welding takes place over the entire thickness of the shield.

In order to make it possible to establish a partial vacuum within the shield during electron beam welding, each support part 82 or 84 has grooves 90 on the surfaces bearing on the hemispheres.

The support is surrounded by a ring 92 located beneath the weld 86 of the two hemispheres 60, 70, in order to protect the support during the electron bombardment operation. The supports 82 and 84 are made from an insulating, amagnetic material, e.g. DELRIN (registered trademark).

To ensure that the field created in the probe by the exciting windings does not constitute an induced current source in the shield, its diameter is preferably three times greater than the probe diameter.

The shield 60, 80 is made from a metal such as aluminum, copper or silver.

The assembly of the illustrated parts takes place in the following order:

1) welding hemisphere 60 and the exhaust tube 100 to form an assembly A;
2) assembly of the probe 80 with its cable 64 in the support part 82 constitute an assembly B;
3) assembly of the protective ring 86 on the support part 84 to constitute an assembly C;
4) assembly of the assemblies B and C to constitute an assembly D;
5) assembly of the assemblies D and A to constitute an assembly E;
6) finally, assembly by welding of the hemisphere 70 and the assembly E.

We claim:

1. A magnetometer comprising:
   a magnetic resonant probe having a resonator with a sample contained therein, a magnetic resonance being exhibited by said sample at a frequency depending on a magnetic field to be measured;

electric supply means connected to said resonator and sampling and exciting windings located around said resonator; and a spherical electromagnetic shield surrounding said sampling and exciting windings.

2. A magnetometer according to claim 1, wherein said shield comprises a first conductive hemisphere having an opening for the passage of a cable connecting said supply means with said resonator of the probe and a second conducting hemisphere for assembly with said first hemisphere.

3. A magnetometer according to claim 2, wherein said probe is held in an amagnetic, insulating support formed from two assembled parts, each part being located in a respective one of said first and second hemispheres, said parts having surfaces bearing on inner surfaces of said hemispheres.

4. A magnetometer according to claim 2, wherein said first and second hemispheres are welded to one another.

5. A magnetometer according to claim 4, wherein said first and second hemispheres are welded to one another by a bead obtained by an electron beam so as to form a weld line between the two hemispheres.

6. A magnetometer according to claim 5, wherein each part of said amagnetic insulating support has grooves in a surface of the part which bears on the hemispheres.

7. A magnetometer according to claim 5, wherein said support is surrounded by a protective ring located below the weld line of said first and second hemispheres.

8. A magnetometer according to claim 2, wherein said first hemisphere is connected to an exhaust tube place around said opening and surrounding said supply cable.

9. A magnetometer according to claim 8, wherein said exhaust tube has a length at least equal to its diameter.

10. A magnetometer according to claim 1, wherein said shield has a diameter which is three times larger than the diameter of the probe.

11. A magnetometer according to claim 1, wherein said shield is made from a metal selected from the group consisting of aluminum, copper and silver.

* * * * *